(12) United States Patent
Ghotgalkar et al.

(10) Patent No.: US 11,444,626 B2
(45) Date of Patent: Sep. 13, 2022

(54) PHASE-LOCKED LOOP SLIP DETECTOR

(71) Applicant: TEXAS INSTRUMENTS INCORPORATED, Dallas, TX (US)

(72) Inventors: Shailesh Ganapat Ghotgalkar, Bengaluru (IN); Wei Fu, Plano, TX (US); Venkatseema Das, Bengaluru (IN); Jiankun Hu, Plano, TX (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 0 days.

(21) Appl. No.: 17/458,001

(22) Filed: Aug. 26, 2021

(65) Prior Publication Data

US 2021/0384913 A1 Dec. 9, 2021

Related U.S. Application Data

(63) Continuation of application No. 16/703,232, filed on Dec. 4, 2019, now Pat. No. 11,133,807.

(60) Provisional application No. 62/865,787, filed on Jun. 24, 2019.

(51) Int. Cl.
*H03L 7/089* (2006.01)
*H03L 7/095* (2006.01)
*H03L 7/087* (2006.01)

(52) U.S. Cl.
CPC ............ *H03L 7/0891* (2013.01); *H03L 7/087* (2013.01); *H03L 7/095* (2013.01)

(58) Field of Classification Search
None
See application file for complete search history.

(56) References Cited

U.S. PATENT DOCUMENTS

| | | | |
|---|---|---|---|
| 4,516,250 A | | 5/1985 | Grimes |
| 4,902,920 A | | 2/1990 | Wolaver |
| 5,790,613 A | * | 8/1998 | Tateishi ................. H04L 7/033 375/376 |
| 6,265,902 B1 | | 7/2001 | Klemmer et al. |
| 6,392,457 B1 | | 5/2002 | Ransijn |
| 7,173,462 B1 | | 2/2007 | Wang |
| 7,876,148 B2 | | 1/2011 | Song et al. |
| 8,368,446 B2 | * | 2/2013 | Jang ..................... H03L 7/0814 327/158 |
| 10,236,896 B1 | | 3/2019 | Ibarra et al. |
| 10,659,062 B2 | * | 5/2020 | Yanagihara ............. H03L 7/099 |
| 10,928,886 B2 | * | 2/2021 | Mosalikanti ........... H03L 7/095 |
| 2007/0205833 A1 | | 9/2007 | Mar et al. |

(Continued)

*Primary Examiner* — Thomas J. Hiltunen
*Assistant Examiner* — Khareem E Almo
(74) *Attorney, Agent, or Firm* — Krista Y. Chan; Charles A. Brill; Frank D. Cimino

(57) ABSTRACT

A phase-locked loop (PLL) includes a phase-frequency detector (PFD) having a first PFD input, a second PFD input, and a PFD output. The PFD is configured to generate a first signal on the PFD output. The first signal comprises pulses having pulse widths indicative of a phase difference between signals on the first and second PFD inputs. A low pass filter (LPF) has an LPF input and an LPF output. The LPF input is coupled to the PFD output. A flip-flop has a clock input and a flip-flop output. The clock input is coupled to the LPF output. A lock-slip control circuit is coupled to the flip-flop output and to the first PFD input. The lock-slip control circuit is configured to determine phase-lock and phase-slip based at least in part on a signal on the flip-flop output.

20 Claims, 3 Drawing Sheets

(56) References Cited

U.S. PATENT DOCUMENTS

| | | | |
|---|---|---|---|
| 2016/0112055 A1* | 4/2016 | Mirajkar | H03L 7/1077 327/158 |
| 2019/0013815 A1 | 1/2019 | Saric | |
| 2019/0280700 A1 | 9/2019 | Janardhanan et al. | |

* cited by examiner

PHASE-LOCKED LOOP SLIP DETECTOR

CROSS-REFERENCE TO RELATED APPLICATIONS

This application is a continuation of U.S. application Ser. No. 16/703,232 filed Dec. 4, 2019, which claims priority to U.S. Provisional Application No. 62/865,787, filed Jun. 24, 2019, each of which is hereby incorporated by reference.

BACKGROUND

A phase-locked loop (PLL) is a circuit that generates an output signal whose phase is related to the phase of its input signal. A PLL typically receives a reference clock as input signal and generates an output clock as its output signal. The PLL strives to maintain a prescribed phase relationship between the output clock and the input reference clock. Deviations in the phase of the output and reference clocks can cause undesirable behaviors of any downstream electronics that rely on the output clock from the PLL.

SUMMARY

In at least one example, a phase-locked loop (PLL) includes a phase-frequency detector (PFD) having a first PFD input, a second PFD input, and a PFD output. The PFD is configured to generate a first signal on the PFD output. The first signal comprises pulses having pulse widths indicative of a phase difference between signals on the first and second PFD inputs. A low pass filter (LPF) has an LPF input and an LPF output. The LPF input is coupled to the PFD output. A flip-flop has a clock input and a flip-flop output. The clock input is coupled to the LPF output. A lock-slip control circuit is coupled to the flip-flop output and to the first PFD input. The lock-slip control circuit is configured to determine phase-lock and phase-slip based at least in part on a signal on the flip-flop output.

BRIEF DESCRIPTION OF THE DRAWINGS

For a detailed description of various examples, reference will now be made to the accompanying drawings in which.

DETAILED DESCRIPTION

The phase of an output clock from a PLL is controlled to maintain a prescribed phase relationship with respect to its input reference clock. For example, the output clock may desirably be phase-locked to the reference clock. An undesirably large phase difference may occur, however, due to, for example, noise that infects the PLL. The reference clock may be susceptible to noise. Further, noise may infect the PLL through the PLL's power supply. Regardless of the source of noise or the reason for a large phase deviation between the input and output clocks to occur, any downstream circuitry that relies on the PLL's output clock being phase-locked to the input reference clock may be detrimentally impacted by the use of an output clock from the PLL that has "slipped." The output clock from the PLL is characterized as being in a "lock" state or a "slip" state. The lock state means that the phase difference between the output and reference clocks is less than a prescribed threshold. The slip state means that the phase difference is larger than the prescribed threshold and the PLL is also referred to in this state as having "lost lock." The disclosed examples are directed to a slip detect circuit for a PLL. The slip detect circuit determines whether the PLL has achieved lock or whether the PLL has slipped. A LOCK signal generated by the slip detect circuit indicates whether the PLL is in lock (e.g., LOCK asserted high) or whether the PLL has slipped (e.g., LOCK asserted low).

Figure 1:
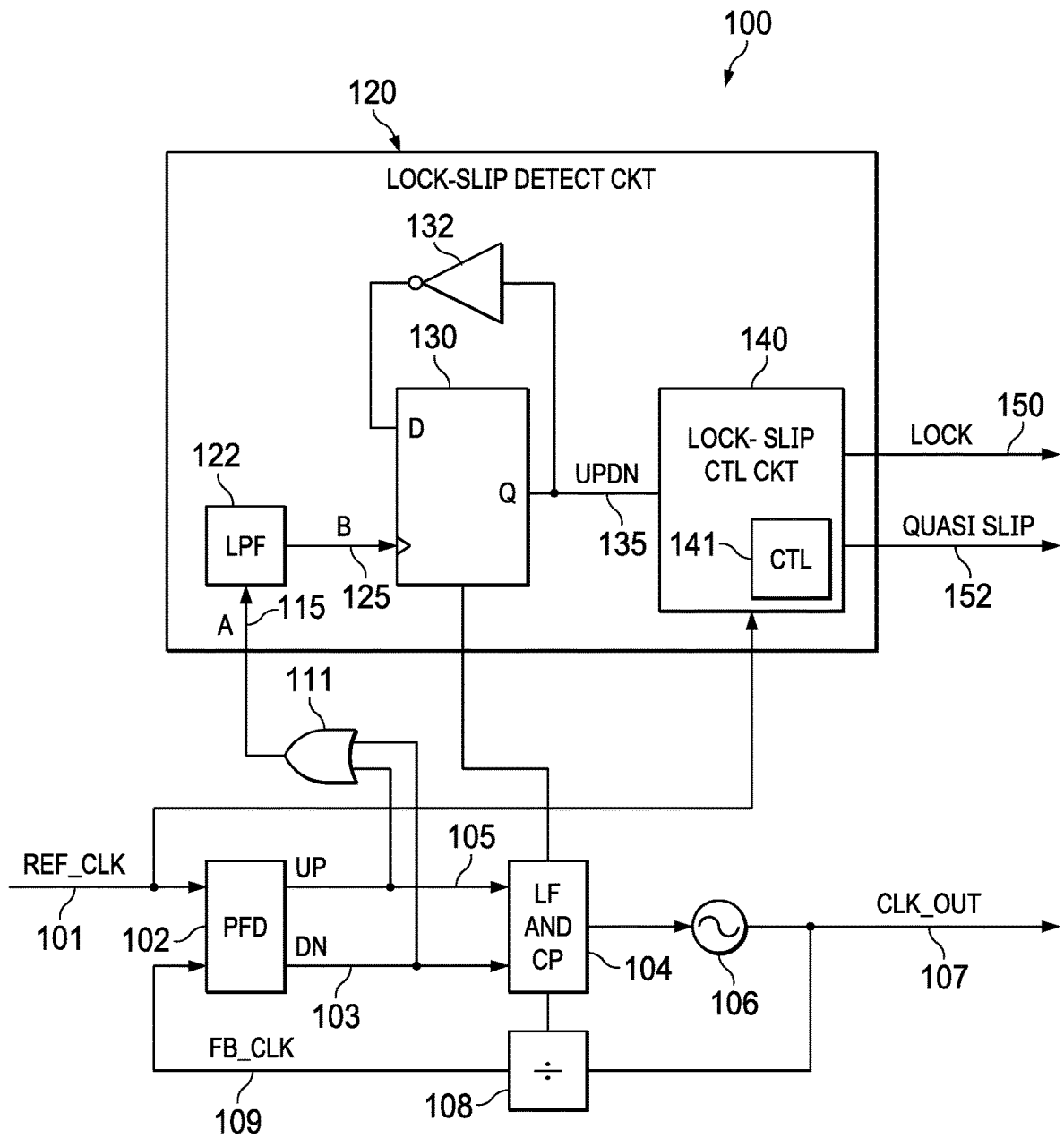
FIG. 1 illustrates an example of a phase-locked loop (PLL) with slip detection.

FIG. 1 shows an example of a PLL 100 including a phase-frequency detector (PFD) 102, a loop filter and charge pump 104, a voltage-controlled oscillator (VCO) 106, a frequency divider 108, and a lock-slip detect circuit 120. In this example, the lock-slip detect circuit 120 includes a low pass filter (LPF) 122, a data (D) flip-flop 130, an inverter 132, and a lock-slip control circuit 140. A reference clock (REF_CLK) 101 is provided to an input of the PFD 102. The frequency of an output clock (CLK_OUT) 107 is divided down by a frequency divider 108 to generate a feedback clock (FB_CLK) 109, which is also provided to another input of the PFD 102.

The PFD 102 is coupled to the loop filter and charge pump 104 and generates output signals UP 105 and DN 103 to the loop filter and charge pump 104. In one example, UP 105 is asserted high by the PFD 102 when FB_CLK 109 lags REF_CLK 101, and DN 103 is asserted high by the PFD 102 when FB_CLK 109 leads REF_CLK 101. An asserted high UP 105 causes the loop filter and charge pump 104 to produce a voltage to the VCO 106 so as to increase its output frequency to thereby reduce the phase difference between FB_CLK 109 and REF_CLK 101. An asserted high DN 103 causes the loop filter and charge pump 104 to produce a voltage to the VCO 106 so as to decrease its output frequency. The frequency divider 108 is included in the example in which the CLK_OUT from the VCO 106 has a frequency that is greater than REF_CLK 101. In examples in which CLK_OUT 107 has the same frequency as REF_CLK 101, a frequency divider is not used and the CLK_OUT is provided directly to the input of the PFD 102. The output signal from the loop filter and charge pump 104 is provided to the VCO 106 and causes the VCO to increase or decrease the frequency of CLK_OUT 107. The feedback loop of the PLL 100 continually monitors the phase and frequency difference between FB_CLK 109 and REF_CLK 101 and responds to any difference by adjusting the operation of the VCO 106 to maintain phase lock.

As explained above, despite the attempts of the PLL 100 to maintain phase lock, the PLL may lose lock (slip). The lock-slip detect circuit 120 determines whether the PLL is in lock or has slipped and generates a LOCK signal 150 accordingly. In one implementation, LOCK is asserted high to indicate a lock condition and asserted low to indicate a slip condition. In another example, LOCK indicates whether the PLL is in lock, and a separate signal is generated by the lock-skip control circuit 140 to indicate slip. The QUASI SLIP signal 152 will be explained below.

The PLL 100 of the example of FIG. 1 also includes an OR gate 111 (or other type of logic gate(s)). OR gate 111 has inputs that are coupled to the PFD's outputs on which UP 105 and DN 103 are generated. Thus, OR gate 111 logically OR's UP 105 and DN 103 together to produce an output signal shown as A 115. Whereas UP 105 and DN 103 indicate whether FB_CLK 109 lags or leads REF_CLK 101, A 115 is indicative of the existence of a phase difference between the REF_CLK 101 and the FB_CLK 109 (without regard to differentiating between a phase lead or a phase lag). OR gate 111 may be separate from PFD 102, or included as part of the PFD 102. The A signal 115 generated by the PFD 102 is provided to the LPF 122. An example of A 115 is shown in the timing diagram of FIG. 2 and further explained below. The LPF 122 low pass filters A 115 to generate B 125. An example of B 125 is shown in the timing diagram of FIG. 2 and further explained below. The output of the LPF 122 is coupled to a clock input of the D flip-flop 130. As such, B 125 is used to clock the D flip-flop 130. The Q output of the D flip-flop 130 is coupled to an input of inverter 132, and the output of the inverter 132 is coupled to the D input of the D flip-flop 130. As such, each time the D flip-flop 130 is clocked by B 125 (e.g., a rising edge of B), the Q output of the D flip-flop 130 changes logic state. The signal produced by the Q output of the D flip-flop 130 is labeled UPDN 135 in FIG. 1. UPDN 135 is provided to an input of the lock-slip control circuit 140. The lock-slip control circuit 140 comprises a hardware state machine comprising logic gates, counters (e.g., one or more counters 141), flip-flops, etc. and generates LOCK 150 and QUASI SLIP 152 as will be explained above.

Figure 2:
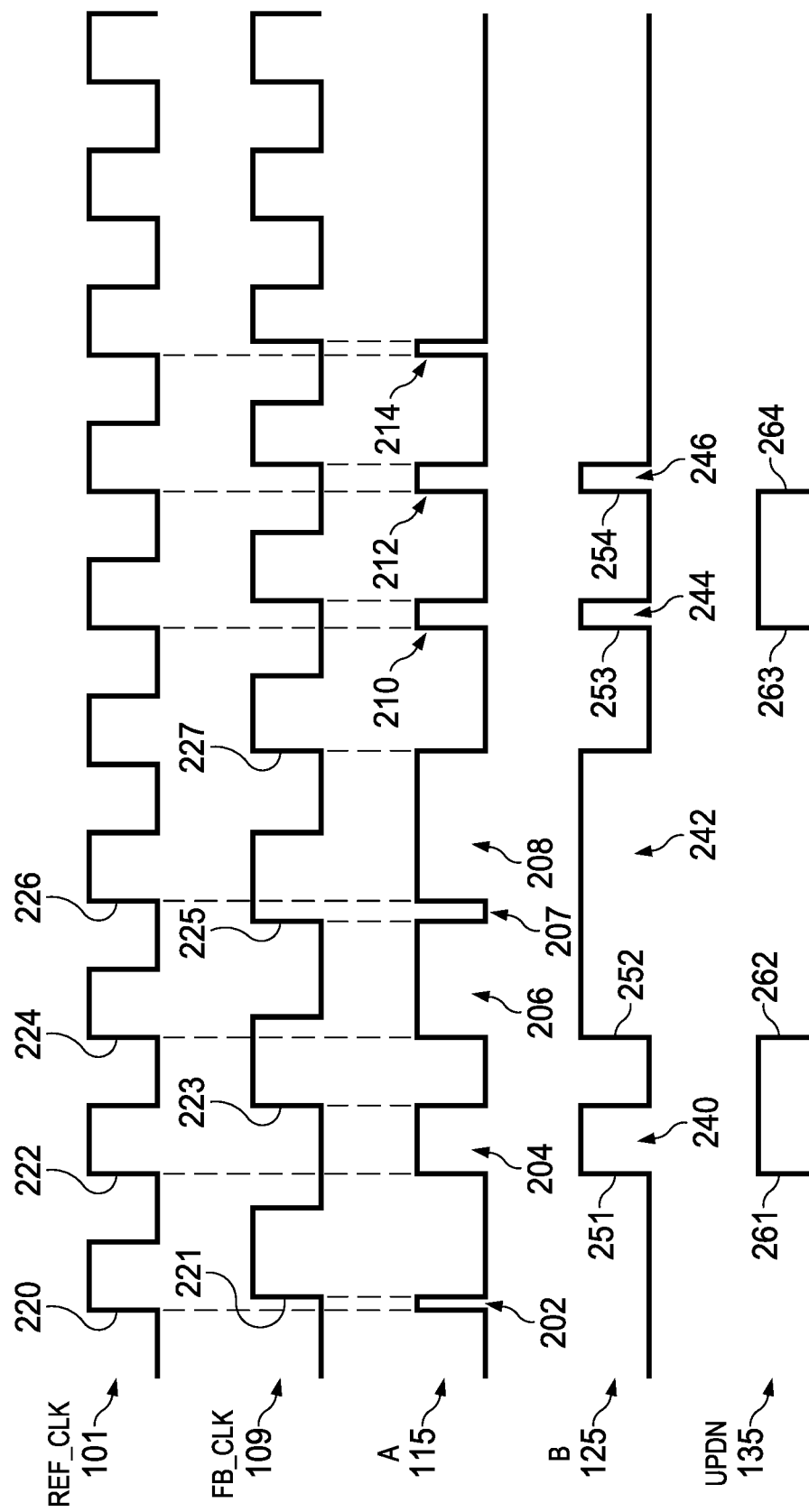
FIG. 2 includes a timing diagram illustrating the operation of the PLL of FIG. 1.

FIG. 2 shows an example timing diagram illustrating the operation of PLL 100. The signals illustrated in FIG. 2 include REF_CLK 101, FB_CLK 109, A 115, B 125, and UPDN 135. Varying amounts of phase difference between REF_CLK 101 and FB_CLK 109 are shown in FIG. 2. Because A 115 is the logical OR of UP and DN, when REF_CLK 101 leads FB_CLK 109, A 115 is asserted high upon the occurrence of a rising edge of REF_CLK 101 and deasserted upon the occurrence of a corresponding rising edge of FB_CLK 109. The example of FIG. 2 shows pulses on A 115 at 202, 204, 206, 208, 210, 212, and 214. The widths of the pulses on A 115 are a function of the phase delay between REF_CLK 101 and FB_CLK 109. For example, the width of pulse 202 is smaller than the width of pulse 204 because rising edges 220 and 221 of REF_CLK 101 and FB_CLK 109, respectively, are closer together than rising edges 222 and 223. The widths of pulses 206 and 208 are relatively large because of the relatively large phase difference between rising edges 224 and 226 of REF_CLK 101 and corresponding edges 225 and 227 of FB_CLK 109.

LPF 122 generates B 125 based on A 115 (B 125 is a low-pass filtered version of A 115). The frequency response of LPF 122 is configured to eliminate A's relatively narrow pulses 202 and 214 from being present in B 125. Further, the relatively short duration negative pulse 207 also is filtered out of A 115 and thus not present in B 125. The narrow duration pulses 202 and 214 represent corresponding clock cycles of REF_CLK 101 and FB_CLK 109 that are less than a threshold amount of phase difference and thus considered to be "in phase" (lock). The pulses 240, 242, 244, and 246 that are present in B 125 correspond to clock cycles of FB_CLK 109 that have a large enough phase difference in relation to REF_CLK 101 so as to be considered "out of phase."

Figure 3:
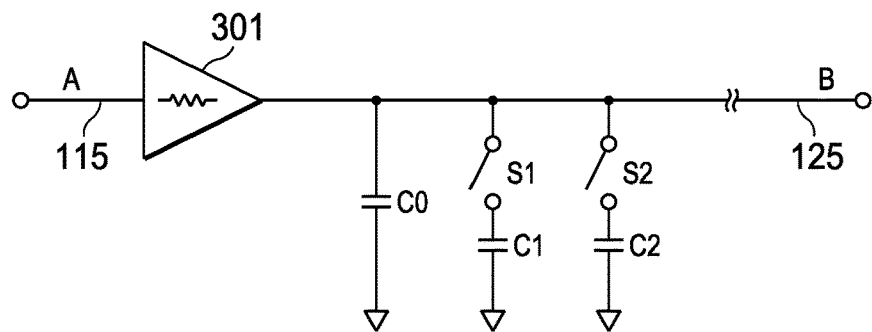
FIG. 3 shows an example circuit implementation for a configurable low-pass filter of the PLL of FIG. 1.

FIG. 3 shows an example implementation of the LPF 122. In this example, the frequency response of the LPF 122 (e.g., its corner frequency) is configurable. As shown in FIG. 3, the LPF 122 includes a buffer 301, capacitors C0, C1, and C2, and switches S1 and S2 (e.g., transistor switches). The input of buffer 301 is coupled to the PFD 102 to receive A 115. The output of the buffer is coupled to capacitor C0 and to switches S1 and S2. Switch S1 connects to capacitor C1 and switch S2 connects to capacitor C2. Capacitor C0 is "always on" and capacitors C1 and C2 can be selectively enabled and disabled by controlling their respective switches S1 and S2. The LPF 122 implements an "RC" filter in which the on-resistance of buffer 301 provides the resistance for the filter and the effective capacitance enabled by control of switches S1 and S2 provides the capacitance for the filter. C0 is always on and represents the minimum amount of capacitance for the filter. The filter capacitance can be increased by closing either or both of switches S1 and S2. Additional switch and capacitor pairs can be included in other examples. In one example, the capacitance of C1 equals that of C0, and the capacitance of C2 is twice that of C0. The capacitor array of C0–C2 (and other capacitors as desired) may comprise a binary-weighted capacitor array. The switches may be controlled by a digital value stored in a configuration register on the same semiconductor die as PLL 100. In one example, with the switches open (off), the capacitance of C0 may be such that the LPF 122 is configured to filter out pulses on A that have a width equal to or smaller than 500 picoseconds (ps). The pulse width that is filtered out by LPF 122 may be increased through closure of one or more of the switches S1, S2.

FIG. 2 also shows UPDN 135 produced by the D flip-flop 130. Because the D flip-flop 130 in this example changes the state of its Q output (UPDN 135) upon a rising edge of its clock input (B 125), the D flip-flop 130 changes the logic state of UPDN 135 upon each occurrence of a rising edge of B 125. As shown, rising edges 251, 252, 253, and 254 of B 125 cause UPDN 135 to change state as shown at 261, 262, 263, and 264. The counters 141 within the example lock-slip control circuit 140 count edges (both rising and falling) of UPDN 135 to determine the occurrence of X UPDN edges in Y cycles of REF_CLK 101. The values of X and Y are configured into the lock-slip control circuit 140 so that a slip is detected upon the occurrence of X or more edges of UPDN 135 in Y cycles of REF_CLK 101. When that condition is met, LOCK 150 is asserted to a state (e.g., low) indicative of the slip state for PLL 100. The REF_CLK 101 also is provided to the lock-slip control circuit 140. The minimum width of a pulse on UPDN 135 is the time duration of at least one cycle of REF_CLK 101. As such, REF_CLK 101 can be used by a counter 141 to count edges of UPDN 135, and a separate (higher frequency) clock is not needed for this purpose. The logic implemented by the lock-slip control circuit 140 to detect a lock condition and to detect a slip condition is described below.

Figure 4:
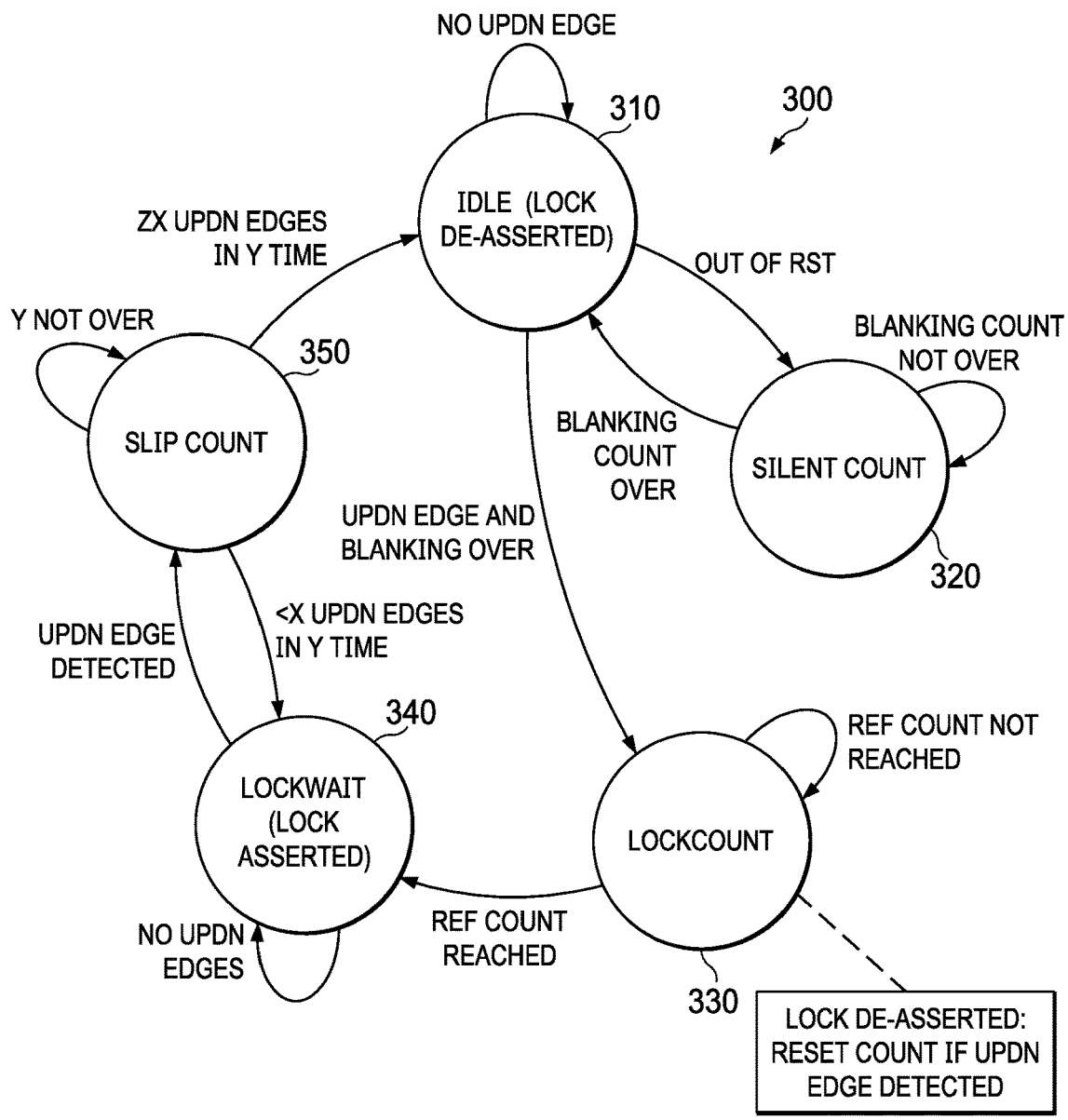
FIG. 4 includes a state diagram of the operation of a lock-slip control circuit for the PLL of FIG. 1.

FIG. 4 illustrates a sample of a state diagram 300 governing the operation of the lock-slip control circuit 140. The states shown in the sample state diagram 300 include IDLE 310, SILENT COUNT 320, LOCK COUNT 330, LOCK WAIT 340, and SLIP COUNT 350. At power-on, the lock-slip control circuit 140 starts in the IDLE state 310, and then transitions to the SILENT COUNT state 320. During the SILENT COUNT state 320, the lock-slip control circuit 140 counts pulses of the REF_CLK 101 corresponding to a BLANKING COUNT period of time. At power-on, it is possible for A 115 not to toggle between high and low due to a large initial phase difference between REF_CLK 101 and FB_CLK 109, and if no pulses on A 115 are present, then the lock-slip control circuit 140 might determine that the PLL 100 is in lock when it has not yet locked CLK_OUT 107 to REF_CLK 101. During the BLANKING COUNT period of time, the lock-slip control circuit 140 does not count edges of UPDN 135 and thus does not determine if a slip condition has occurred, nor whether a lock condition has occurred.

Upon the BLANKING COUNT period of time ending, the IDLE state 310 is re-entered, and the lock-slip control circuit 140 remains in this state as long as no UPDN edges are detected. Upon the occurrence of the first UPDN edge following the end of the BLANKING COUNT period of time, the state transitions from the IDLE state 310 to the LOCK COUNT state 330. While in the LOCK COUNT state 330, the lock-slip control circuit 140 counts for a REF COUNT period of time. In one example, the lock-slip control circuit 140 counts pulses of REF_CLK corresponding to the REF COUNT period of time. REF COUNT represents a period of time during which the absence of any UPDN edges indicates that the PLL 100 has achieved lock. While in the LOCK COUNT state 330, LOCK 150 is deasserted (to indicate that phase lock has not been yet been achieved). Upon detection of an UPDN edge, the counter which counts REF COUNT is reset.

When the REF COUNT counter expires, which means no UPDN edge was detected, the lock-slip control circuit 140 transitions to the LOCK WAIT state 340. While in the LOCK WAIT state, LOCK 150 is asserted to indicate that PLL 100 has achieved lock. As long as no UPDN edges are detected, the lock-slip control circuit 140 remains in the LOCK WAIT state 340. Upon detection of an UPDN edge, the lock-slip control circuit 140 transitions to the SLIP COUNT state 350.

While in the SLIP COUNT state 350, the lock-slip control circuit 140 counts cycles of REF_CLK 101 for a period of time Y. Over the course of Y time, if fewer than X UPDN edges are detected, then an insufficient number of UPDN edges are detected to affirmatively determine that the PLL 100 has slipped, and the lock-slip control circuit 140 transitions its state back to the LOCK WAIT state 340. LOCK 150 continues to be asserted to indicate that the PLL 100 remains in phase lock. However, if X or more UPDN edges are detected in the Y period of time, then the lock-slip control circuit 140 affirmatively determines that the PLL has slipped and the lock-slip control circuit 140 transitions its state to the IDLE state 310 in which LOCK 150 is deasserted indicating loss of lock (i.e., the PLL has slipped). The values of X and Y may be designed into the lock-slip control circuit 140 or may be user-configurable. In one example, X is 16 and Y is 32, meaning that slip is determined if the lock-slip control circuit 140 detects 16 or more UPDN edges in 32 cycles of REF CLK 101.

FIG. 1 illustrates that the lock-slip control circuit 140 also generates QUASI SLIP 152. The quasi slip feature of the PLL 100 may be enabled or disabled by a user (e.g., programming a control register within the PLL 100). If enabled, the lock-slip control circuit 140 asserts QUASI SLIP 152 responsive to the lock-slip control circuit 140 being in the SLIP COUNT state 350. That is, while LOCK 150 is asserted, if even one edge of UPDN 135 is detected, then QUASI SLIP 152 is asserted, even though the lock-slip control circuit 140 has not yet affirmatively determined that the PLL has slipped. An asserted QUASI SLIP 152 (with a deasserted LOCK 150) indicates that the PLL is still determined to be in phase lock, but that at least one cycle of FB_CLK 109 is out of phase with respect to REF_CLK 101 by more than a threshold value that would cause LOCK to be deasserted if X or more UPDN edges out of Y REF_CLK cycles were detected (e.g., the maximum width of the A 115 pulses that is filtered out by LPF 122 from being present in B 125). Any circuitry that uses CLK_OUT 107 from the PLL 100 and that is particularly sensitive to any cycles of CLK_OUT that are substantially out of phase with respect to REF_CLK 101 can respond to the assertion of QUASI SLIP 152 in a suitable, application-specific manner.

In addition to detecting slip based on the occurrence of X or more UPDN edges out of Y REF_CLK 101 cycles, the lock-slip control circuit 140 can also detect slip based on the occurrence of n*X UPDN edges out of m*Y REF_CLK cycles, where m may be greater than n. The values of m and m may be configurable (e.g., in an externally-accessible configuration register) to tune the sensitivity as per application requirements. In one example, n is 3 and m is 4. As such, the lock-slip control circuit 140 determines slip to have occurred if 3X UPDN edges occurs in 4Y REF_CLK cycles. In the example above, X is 16 and Y is 32, and thus slip is detected if 48 UPDN edges are detected in 128 REF_CLK cycles. The lock-slip control circuit 140 determines slip to have occurred if either or both of the following conditions are true: (a) X or more UPDN edges occur out of Y REF_CLK cycles, or (b) n*X (or more) UPDN edges occur out of m*Y REF_CLK cycles.

The term "couple" is used throughout the specification. The term may cover connections, communications, or signal paths that enable a functional relationship consistent with the description of the present disclosure. For example, if device A generates a signal to control device B to perform an action, in a first example device A is coupled to device B, or in a second example device A is coupled to device B through intervening component C if intervening component C does not substantially alter the functional relationship between device A and device B such that device B is controlled by device A via the control signal generated by device A.

What is claimed is:

1. A circuit, comprising:
 a phase-locked loop (PLL) circuit; and
 a lock-slip detect circuit coupled to the PLL, the lock-slip detect circuit including:
  a low pass filter (LPF) having an LPF input and an LPF output;
  a flip-flop having a flip-flop clock input and a flip-flop output, the flip-flop clock input coupled to the LPF output; and
  a lock-slip control circuit coupled to the flip-flop output, wherein the lock-slip control circuit is configured to determine phase-lock, quasi phase-slip, and phase-slip of the PLL circuit.

2. The circuit of claim 1, wherein:
 the flip-flop has a flip-flop input, and wherein the PLL includes an inverter coupled between the flip-flop output and the flip-flop input.

3. The circuit of claim 1, wherein:
 the lock-slip control circuit receives a reference clock.

4. The circuit of claim 3, wherein:
 the lock-slip control circuit includes a counter circuit configured to count a number of edges on the flip-flop output in a predetermined number of cycles of the reference clock.

5. The circuit of claim 4, wherein:
 the lock-slip control circuit is configured to assert a lock signal indicating that the PLL is in phase-lock responsive to the number of edges being zero.

6. The circuit of claim 4, wherein:
 the lock-slip control circuit is configured to de-assert a lock signal indicating that the PLL is not in phase-lock responsive to the number of edges being greater than or equal to a first threshold number.

7. The circuit of claim 6, wherein:
the lock-slip control circuit is configured to assert a quasi slip signal responsive to the number of edges being greater than a second threshold number and less than the first threshold number.

8. The circuit of claim 1, wherein:
the flip-flop is coupled to a loop filter and a charge pump of the PLL circuit.

9. The circuit of claim 1, wherein:
the LPF input is coupled to an output of a logic gate;
a first input of the logic gate is coupled to a first output of a phase-frequency detector (PFD); and
a second input of the logic gate is coupled to a second output of the PFD.

10. The circuit of claim 9, wherein:
the logic gate is an OR gate.

11. The circuit of claim 9, wherein:
the LPF includes a buffer having a resistance and a capacitance that determine a frequency response; and
the frequency response is configured to filter out signals from the logic gate having a pulse width below a pulse width threshold.

12. The circuit of claim 11, wherein:
the capacitance includes a plurality of capacitors.

13. The circuit of claim 11, wherein:
the capacitance includes a first capacitor, a second capacitor coupled to a first switch, and a third capacitor coupled to second switch.

14. The circuit of claim 13, wherein:
the first switch and the second switch are configured to adjust the frequency response of the LPF.

15. The circuit of claim 13, wherein:
the first switch and the second switch are controlled by a value stored in a configuration register.

16. The circuit of claim 1, wherein:
the LPF is configured to filter signals having a pulse width less than or equal to 500 picoseconds.

17. A system, comprising:
a low pass filter (LPF) having an LPF input and an LPF output;
a flip-flop having a flip-flop clock input and a flip-flop output, the flip-flop clock input coupled to the LPF output; and
a lock-slip control circuit coupled to the flip-flop output, wherein the lock-slip control circuit is configured to output an indicator indicating one of a phase-lock and a quasi phase-slip.

18. The system of claim 17, further comprising:
an inverter having an inverter input coupled to the flip-flop output and an inverter output coupled to a flip-flop input of the flip-flop.

19. The system of claim 17, wherein:
the lock-slip control circuit includes a counter circuit configured to count a number of edges on the flip-flop output in a predetermined number of cycles of a reference clock;
the lock-slip control circuit is configured to assert the indicator indicating that the PLL is in phase-lock responsive to the number of edges being zero; and
the lock-slip control circuit is configured to assert the indicator indicating quasi slip responsive to the number of edges being between a first threshold and a second threshold.

20. A method for detecting slip in a phase-locked loop (PLL), comprising:
receiving, by a low pass filter (LPF), a signal from a phase-frequency detector (PFD);
filtering, by the LPF, the signal from the PFD to remove pulse widths below a first threshold to produce a filtered signal;
receiving, by a flip-flop, the filtered signal;
generating, by the flip-flop, a flip-flop output signal based on the filtered signal;
counting, by a lock-slip control circuit, a number of edges of the flip-flop output signal over a period of time;
in response to the number of edges of the flip-flop output signal being zero in the period of time, outputting, by the lock-slip control circuit, a phase-lock signal;
in response to the number of edges of the flip-flop output signal being between a second threshold and a third threshold, outputting, by the lock-slip control circuit, a quasi phase-slip signal; and
in response to the number of edges of the flip-flop output signal being at or greater than the third threshold, outputting, by the lock-slip control circuit, a phase-slip signal.

* * * * *